(12) United States Patent  
Wallace et al.

(10) Patent No.: US 6,621,483 B2  
(45) Date of Patent: Sep. 16, 2003

(54) OPTICAL SCREEN POINTING DEVICE WITH INERTIAL PROPERTIES

(75) Inventors: Hugh Wallace, Ft. Collins, CO (US); Gary B. Gordon, Saratoga, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 197 days.

(21) Appl. No.: 09/810,745

(22) Filed: Mar. 16, 2001

(65) Prior Publication Data

US 2002/0130839 A1 Sep. 19, 2002

(51) Int. Cl.⁷ .................................................. G09G 5/00
(52) U.S. Cl. ........................................ 345/157; 250/221
(58) Field of Search ................................ 345/152, 158, 345/159, 156, 173, 175, 177; 178/18.01–18.07, 19.01–19.03

(56) References Cited

U.S. PATENT DOCUMENTS

| | | | |
|---|---|---|---|
| 5,578,813 A | 11/1996 | Allen et al. | 250/208.1 |
| 5,644,139 A | 7/1997 | Allen et al. | 250/557 |
| 5,786,804 A | 7/1998 | Gordon | 345/158 |
| 5,825,352 A * | 10/1998 | Bisset et al. | 345/173 |
| 5,994,710 A | 11/1999 | Knee et al. | 250/557 |
| 6,057,540 A | 5/2000 | Gordon et al. | 250/221 |
| 6,151,015 A | 11/2000 | Badyal et al. | 345/179 |
| 6,424,407 B1 * | 7/2002 | Kinrot et al. | 356/28 |
| 6,452,683 B1 * | 9/2002 | Kinrot et al. | 356/499 |

OTHER PUBLICATIONS

"Seeing Eye" Mouse for a Computer System, U.S. patent application Ser. No. 09/052,046, filed Mar. 30, 1998.

* cited by examiner

*Primary Examiner*—Vijay Shankar  
*Assistant Examiner*—Nitin Patel (57) ABSTRACT

An apparatus for controlling the position of a screen pointer for an electronic device having a display screen includes an imaging surface against which a portion of the tip of a human digit may be placed. A light source illuminates that portion of the tip of the digit that is placed against the imaging surface, thereby generating reflected images. The apparatus includes a motion transducer. A lens receives the reflected images and directs the reflected images onto the motion transducer. The motion transducer generates digital representations of the reflected images. The motion transducer generates a first set of movement data based on the digital representations of the reflected images. The first set of movement data is indicative of motion of the tip of the digit across the imaging surface. A controller generates a second set of movement data when the tip of the human digit is removed from the imaging surface. The second set of movement data is indicative of motion of the tip of the digit across the imaging surface prior to removal of the tip.

39 Claims, 4 Drawing Sheets

OPTICAL SCREEN POINTING DEVICE WITH INERTIAL PROPERTIES

REFERENCE TO RELATED PATENTS

This Application is related to the subject matter described in the following U.S. patents: U.S. Pat. No. 5,578,813, filed Mar. 2, 1995, issued Nov. 26, 1996, and entitled FREEHAND IMAGE SCANNING DEVICE WHICH COMPENSATES FOR NON-LINEAR MOVEMENT; U.S. Pat. No. 5,644,139, filed Aug. 14, 1996, issued Jul. 1, 1997, and entitled NAVIGATION TECHNIQUE FOR DETECTING MOVEMENT OF NAVIGATION SENSORS RELATIVE TO AN OBJECT; and U.S. Pat. No. 5,786,804, filed Oct. 6, 1995, issued Jul. 28, 1998, and entitled METHOD AND SYSTEM FOR TRACKING ATTITUDE. These three patents describe techniques of tracking position movement and computer pointing devices. Those techniques are a component in a preferred embodiment described below. Accordingly, U.S. Pat. Nos. 5,578,813, 5,644,139, and 5,786,804 are hereby incorporated herein by reference.

This application is also related to the subject matter described in U.S. Pat. No. 6,057,540, filed Apr. 30, 1998, issued May 2, 2000, and entitled MOUSELESS OPTICAL AND POSITION TRANSLATION TYPE SCREEN POINTER CONTROL FOR A COMPUTER SYSTEM; U.S. Pat. No. 6,151,015, filed Apr. 27, 1998, issued Nov. 21, 2000, and entitled PEN LIKE COMPUTER POINTING DEVICE; and U.S. patent application Ser. No. 09/052,046, filed Mar. 30, 1998, entitled SEEING EYE MOUSE FOR A COMPUTER SYSTEM. These two related patents and patent application describe screen pointing devices based on the techniques described in U.S. Pat. Nos. 5,578,813, 5,644,139, and 5,786,804. Therefore, U.S. Pat. Nos. 6,057,540 and 6,151,015, and U.S. patent application Ser. No. 09/052,046, filed Mar. 30, 1998, entitled SEEING EYE MOUSE FOR A COMPUTER SYSTEM, are hereby incorporated herein by reference.

THE FIELD OF THE INVENTION

This invention relates generally to devices for controlling a cursor on a display screen, also known as pointing devices. This invention relates more particularly to an optical pointing device with inertial properties.

BACKGROUND OF THE INVENTION

The use of a hand operated pointing device for use with a computer and its display has become almost universal. By far the most popular of the various devices is the conventional (mechanical) mouse, used in conjunction with a cooperating mouse pad. Centrally located within the bottom surface of the mouse is a hole through which a portion of the underside of a rubber-surfaced steel ball extends. The mouse pad is typically a closed cell foam rubber pad covered with a suitable fabric. Low friction pads on the bottom surface of the mouse slide easily over the fabric, but the rubber ball does not skid. Rather, the rubber ball rolls over the fabric as the mouse is moved. Interior to the mouse are rollers, or wheels, that contact the ball at its equator and convert its rotation into electrical signals representing orthogonal components of mouse motion. These electrical signals are coupled to a computer, where software responds to the signals to change by a $\Delta X$ and a $\Delta Y$ the displayed position of a pointer (cursor) in accordance with movement of the mouse. The user moves the mouse as necessary to get the displayed pointer to a desired location or position. Once the pointer on the screen points at an object or location of interest, a button on the mouse is activated with the fingers of the hand holding the mouse. The activation serves as an instruction to take some action, the nature of which is defined by software in the computer.

A "track ball" is another example of a mechanical type of pointing device. A track ball is essentially an upside-down mouse. In a track ball, rather than sliding the device itself over a surface to produce pointer movement as in a mouse, a user directly contacts the mechanical ball with the user's finger, and causes the ball to rotate. As with a mouse, the movement of the mechanical ball in a track ball generates a corresponding movement of the displayed pointer.

In a track ball, the mechanical ball can be "flicked" with the finger, and the ball will continue to rotate under its own momentum after the user's finger is removed from the ball. The rotation continues until the user contacts the mechanical ball again, or until frictional forces eventually cause the ball to stop rotating. The inertial properties of a track ball that allow it to continue to generate pointer movement after the user stops contacting the mechanical ball result in good dynamic range. Small hand movements can result in large pointer movements. The inertial properties of a track ball are useful in some applications, such as game applications, where large and quick pointer movements are sometimes desirable. Some mechanical mouse devices may also provide inertial effects like a track ball. A mechanical mouse may be moved quickly over the mouse pad, and then lifted from the pad, allowing the ball to continue to rotate under its own momentum. Some mechanical mouse devices, however, cause the ball to immediately stop movement when the mouse is lifted from the mouse pad.

Optical pointing devices do not use a mechanical ball, or other similar moving mechanical element that has inertial properties. In one form of an optical pointing device, rather than using a moving mechanical element, relative movement between an imaging surface, such as a finger or a desktop, and photo detectors within the optical pointing device, is optically sensed and converted into movement information. It would be desirable in some applications for an optical pointing device to provide inertial effects, such as that provided by a track ball. It would also be desirable for an optical pointing device to have a velocity profile that is user definable.

SUMMARY OF THE INVENTION

The present invention provides an apparatus for controlling the position of a screen pointer for an electronic device having a display screen includes an imaging surface against which a portion of the tip of a human digit may be placed. A light source illuminates that portion of the tip of the digit that is placed against the imaging surface, thereby generating reflected images. The apparatus includes a motion transducer. A lens receives the reflected images and directs the reflected images onto the motion transducer. The motion transducer generates digital representations of the reflected images. The motion transducer generates a first set of movement data based on the digital representations of the reflected images. The first set of movement data is indicative of motion of the tip of the digit across the imaging surface. A controller generates a second set of movement data when the tip of the human digit is removed from the imaging surface. The second set of movement data is indicative of motion of the tip of the digit across the imaging surface prior to removal of the tip.

One aspect of the present invention provides a method of controlling the position of a screen pointer for an electronic device having a screen display. A portion of an appendage of the human hand is placed against an imaging surface. Light is directed onto the imaging surface to illuminate that portion of the appendage that is against the imaging surface. Images reflected from the portion of the appendage are focused onto an array of photo detectors. Output values of the photo detectors are digitized, thereby generating digital representations of the reflected images. At least one version of a first one of the digital representations is correlated with at least one version of a second one of the digital representations to generate a first set of motion data indicative of motion in orthogonal axes across the imaging surface by the appendage. The position of the screen pointer is adjusted in accordance with the first set of motion data. A second set of motion data is generated based on at least a subset of the first set of motion data after the appendage is removed from the imaging surface. The position of the screen pointer is adjusted in accordance with the second set of motion data after the appendage is removed from the imaging surface.

Another form of the present invention provides a method of controlling the position of a screen pointer for an electronic device having a screen display. Light is directed onto a work surface, thereby generating reflected images. Reflected images are focused onto an array of photo detectors. The array of photo detectors is moved relative to the work surface at a substantially constant distance from the work surface. Digital representations of the reflected images are generated based on outputs of the photo detectors. At least one version of a first one of the digital representations is correlated with at least one version of a second one of the digital representations to generate a first set of motion data indicative of the motion of the array of photo detectors relative to the work surface. The position of the screen pointer is adjusted in accordance with the first set of motion data. A second set of motion data is generated based on at least a subset of the first set of motion data when the array of photo detectors is lifted from the work surface beyond the substantially constant distance. The position of the screen pointer is adjusted in accordance with the second set of motion data.

Another form of the present invention provides an apparatus for controlling the position of a screen pointer for an electronic device having a display screen. A light source illuminates a work surface, thereby generating reflected images. A motion transducer is moved relative to the work surface at a substantially constant distance from the work surface. A lens receives the reflected images and directs the reflected images onto the motion transducer. The motion transducer generates digital representations of the reflected images. The motion transducer generates a first set of movement data based on the digital representations of the reflected images. The first set of movement data is indicative of motion of the motion transducer relative to the work surface. A controller generates a second set of movement data when the motion transducer is lifted past the substantially constant distance from the work surface. The second set of movement data is indicative of motion of the motion transducer relative to the work surface prior to the motion transducer being lifted past the substantially constant distance.

Another form of the present invention provides a computer-readable medium having computer-executable instructions for performing a method of generating movement data for controlling the position of a screen pointer for an electronic device having a screen display and an optical pointing device. The optical pointing device generates movement data when in contact with an imaging surface. The movement data is indicative of relative movement between the imaging surface and the optical pointing device. The method includes identifying when a loss of contact occurs between the optical pointing device and the imaging surface. A first set of movement data is identified. The first set of movement data is indicative of the relative movement between the imaging surface and the optical pointing device prior to the loss of contact. A second set of movement data is generated based on the first set of movement data when a loss of contact occurs between the optical pointing device and the imaging surface. The second set of movement data causes a gradual decrease in a velocity of the screen pointer.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
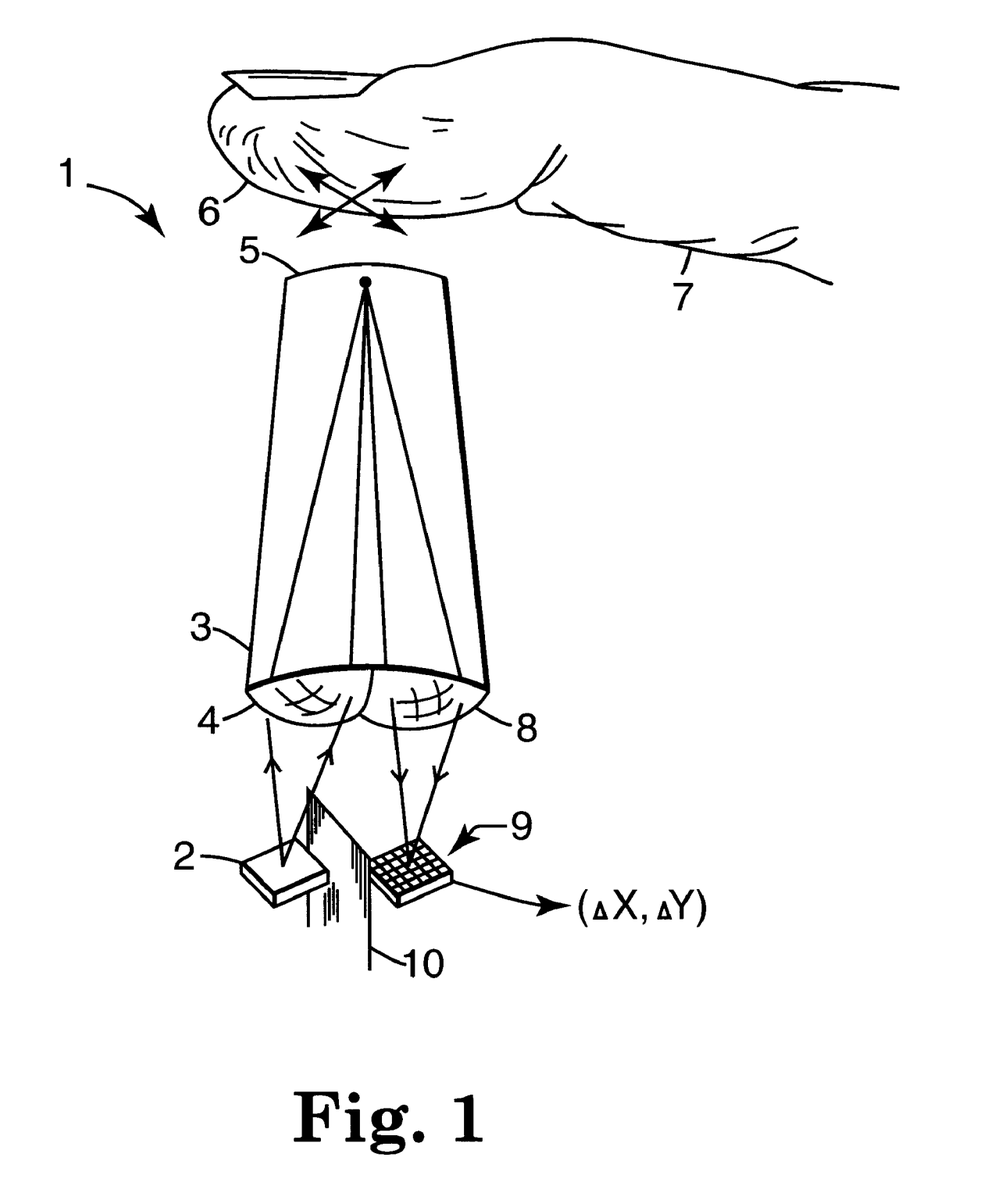
FIG. 1 is a pictographic side view of the main components of one embodiment of an optical, motion translation type screen pointer device according to the present invention.

FIG. 1 shows a simplified representation of a side view of a motion detection arrangement 1 suitable for tracking the movement of a human finger 7 pressed against a surface 5 of a transparent stud 3, which is made of plastic in one embodiment. A motion detection arrangement like that shown in FIG. 1 is described in detail in the above-incorporated U.S. Pat. No. 6,057,540 (the '540 patent). The operation of motion detection arrangement 1 is also summarized below. Although the present invention is described with reference to the particular optical pointing device arrangement shown in FIG. 1, the techniques described herein are also applicable to other optical pointing devices, including an optical mouse, such as that disclosed in the above-incorporated U.S. patent application Ser. No. 09/052,046, and including an optical pen-like pointing device, such as that disclosed in the above-incorporated U.S. Pat. No. 6,151,015.

A light source 2, which is an LED in one embodiment, emits light that is gathered and focused by lens 4 to illuminate surface 5. Surface 5 may be flat, or preferably, have a slight curvature. Curvature aids in enlarging the size of the region of surface 5 that is in focus for the motion detector 9 described below. Surface 5 may be a glass or other wear resistant coating applied to the end of transparent stud 3. In one form of the present invention, surface 5 is about $3/16$ to ¼ of an inch in diameter, and the length of transparent stud 3 ranges from about ⅜ to ¾ of an inch. Another term that is descriptive of transparent stud 3 is "rod lens". Opaque barrier 10 keeps stray light from LED 2 from reaching motion detector 9.

When the tip 6 of finger 7 is pressed against surface 5, the ridges of skin and any other micro texture features are visible in the plane of surface 5, just as if they were a part of surface 5. Lens 8 focuses light from those features onto an array of photo detectors, which is part of movement sensor 9. Movement sensor 9 automatically acquires and tracks any suitable image. When tracking an image, movement sensor 9 produces incremental (X, Y) signals (i.e., velocity signals in two dimensions).

Lifting fingertip 6 away from surface 5 by more than a fraction of a millimeter defocuses the image and produces a loss of tracking. This condition is detected within motion detector 9, and in one embodiment, the production of incremental (X, Y) signals continues, with gradually decreasing magnitudes. This has the effect of continuing the motion of the screen pointer. In one form of the present invention, the continued motion is similar to the motion of a screen pointer when a mechanical ball of a track ball is "flicked." When fingertip 6 is subsequently replaced on surface 5, motion detector 9 appreciates that an image has been acquired, and, in one embodiment, treats that acquisition as though a reset has been performed. That is, until there has been new motion subsequent to the new acquisition, the incremental coordinates (X, Y) will have the value (0, 0). Thus, if the screen pointer is moving when fingertip 6 is replaced on surface 5, the movement stops when motion detector 9 detects the contact. The screen pointer remains at the position where it stopped until motion detector 9 detects motion of fingertip 6 on surface 5.

Motion sensor 9 uses exactly or substantially the same technique as the imaging and navigation arrangement described in the incorporated Patents. In the particular operational settings described therein, it was desirable that there be some magnification of the image before it reached the sensor, because of the small size of the micro-features being imaged and tracked (e.g., paper fibers). Here, the features on fingertip 6 are really quite large in comparison, so that magnification is not used in one embodiment. Even though one form of an imaging and navigation mechanism is described in the incorporated Patents, a brief overview of the technique is provided below.

An LED 2, which is an IR LED in one embodiment, emits light that is projected by lens 4 onto a region 5 that is part of a work surface 6 to be imaged for navigation. In one form of the present invention, motion sensor 9 is an integrated circuit (IC) having an array of photo detectors, memory, and arithmetic circuits arranged to implement image correlation and tracking functions described herein and in the incorporated patents. An image of the illuminated region 6 is projected through an optical window (which may be transparent stud 3 itself) to a package (not shown) of integrated circuit 9 and onto the array of photo detectors. Lens 8 aids in the projection of the image onto the photo detectors.

One preferred optical navigation technique according to the present invention optically detects motion by directly imaging as an array of pixels the various particular optical features visible at surface 5, much as human vision is believed to do. IR light reflected from a textured work surface pressed against surface 5 is focused onto a suitable array (e.g., 16×16 or 24×24) of photo detectors. The responses of the individual photo detectors are digitized to a suitable resolution (e.g., six or eight bits) and stored as a frame into corresponding locations within an array of memory. In one embodiment, each pixel in a frame corresponds to one of the photo detectors.

The overall size of the array of photo detectors is preferably large enough to receive an image having several features (e.g., ridges in the whorls of skin). In this way, images of such spatial features produce translated patterns of pixel information as fingertip 6 moves. The number of photo detectors in the array and the frame rate at which their contents are digitized and captured cooperate to influence how fast fingertip 6 can be moved over surface 5 and still be tracked. Tracking is accomplished by comparing a newly captured sample frame with a previously captured reference frame to ascertain the direction and amount of movement.

In one embodiment, the entire content of one of the frames is shifted by a distance of one pixel successively in each of the eight directions allowed by a one pixel offset trial shift (one over, one over and one down, one down, one up, one up and one over, one over in the other direction, etc.). That adds up to eight trials. Also, since there might not have been any motion, a ninth trial "null shift" is also used. After each trial shift, those portions of the frames that overlap each other are subtracted on a pixel by pixel basis, and the resulting differences are preferably squared and then summed to form a measure of similarity (correlation) within that region of overlap. Larger trial shifts are possible, of course (e.g., two over and one down), but at some point the attendant complexity ruins the advantage, and it is preferable to simply have a sufficiently high frame rate with small trial shifts. The trial shift with the least difference (greatest correlation) can be taken as an indication of the motion between the two frames. That is, it provides raw movement information that may be scaled and or accumulated to provide display pointer movement information (ΔX and ΔY) of a convenient granularity and at a suitable rate of information exchange.

Sensor 9 automatically detects when fingertip 6 has been removed from surface 5, by sensing that all or a majority of the pixels in the image have "gone dark." The process is actually somewhat more complicated than that, as explained below.

When fingertip 6 is removed from surface 5, the IR light from the illuminating LED 2 no longer reaches the photo detectors in the same quantity that it did previously, if at all; the reflecting surface is too far away or is simply not in view. However, if fingertip 6 is removed and the surface 5 is exposed to an intensely lit environment as a result, then the outputs of the photo detectors might be at any level. The key is that the outputs of the photo detectors will be uniform, or nearly so. The main reason that the outputs become uniform is that there is no longer a focused image. All of the image features are indistinct and they are each spread out over the entire collection of photo detectors. Therefore, the photo detectors uniformly come to some average level. This is in distinct contrast with the case when there is a focused image. In the focused case, the correlations between frames (recall the one over, one over and one down, etc.) exhibit a distinct phenomenon.

In operation, images should be acquired at a rate sufficient that successive images differ in distance by no more that perhaps a quarter of the width of the array, or 4 pixels for a 16×16 array of photo sensors. Experiments show that a finger speed of 50 mm/sec is not unreasonable. With 1:1 imaging, this corresponds to a speed at the array of 800 pixels per second. To meet a requirement of not moving more than four pixels per cycle, a measurement rate of 200 samples per second is needed. This rate is quite practical, and it may be desirable to operate at several times this rate.

Figure 2:
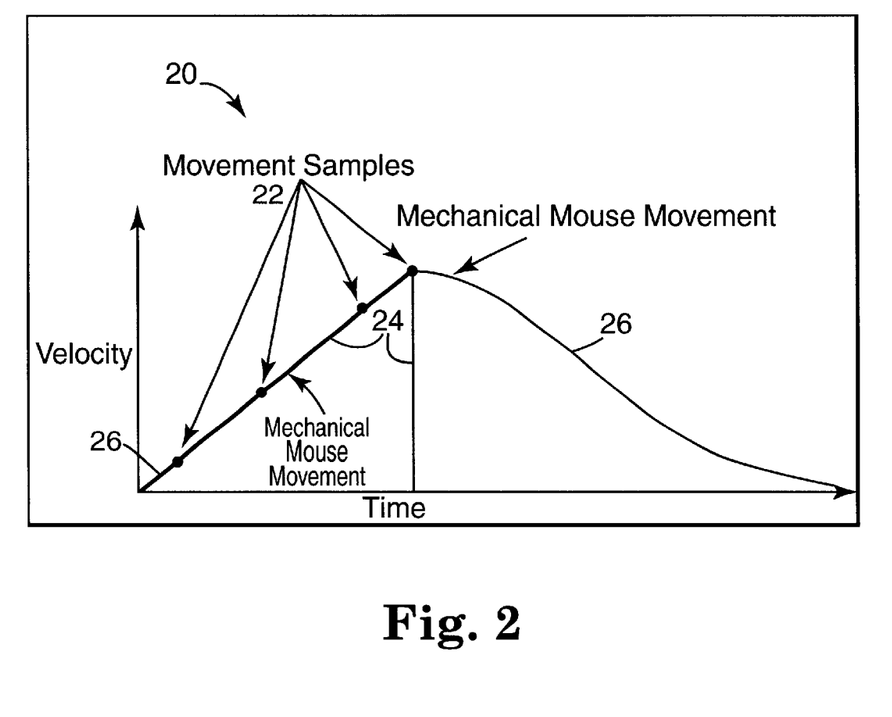
FIG. 2 is a graph illustrating typical velocity profiles for a mechanical pointing device, such as a track ball, and an optical pointing device.

FIG. 2 is a graph illustrating typical velocity profiles for a mechanical pointing device, such as a track ball, and an optical pointing device. Graph 20 includes a horizontal axis, a vertical axis, curve 24, and curve 26. The horizontal axis of graph 20 represents time, and the vertical axis represents velocity. Curve 26 illustrates the velocity versus time or velocity profile of a mechanical mouse or track ball when it is "flicked", or quickly accelerated and then released. The total distance moved is proportional to the area under curve 26. Curve 26 is generated from a series of velocity samples 22. As shown by curve 26, the velocity of the mechanical ball in the track ball initially increases at a near constant rate, with the velocity increase caused by a finger beginning a flicking action on the ball. After the mechanical ball is flicked and released, the velocity of the ball gradually decays to zero. In contrast, for a typical optical pointing device, when a user removes his finger from the device after performing a flicking action, the velocity instantly drops to zero as shown by curve 24. Curves 24 and 26 are representative of typical velocity profiles for one type of pointer device movement, and will vary depending upon the exact movement caused by a user. In one form of the present invention, the velocity profile of a mechanical mouse or track ball represented by curve 26 is used as a model in determining an appropriate velocity profile for an optical pointing device with inertial properties.

Figure 3:
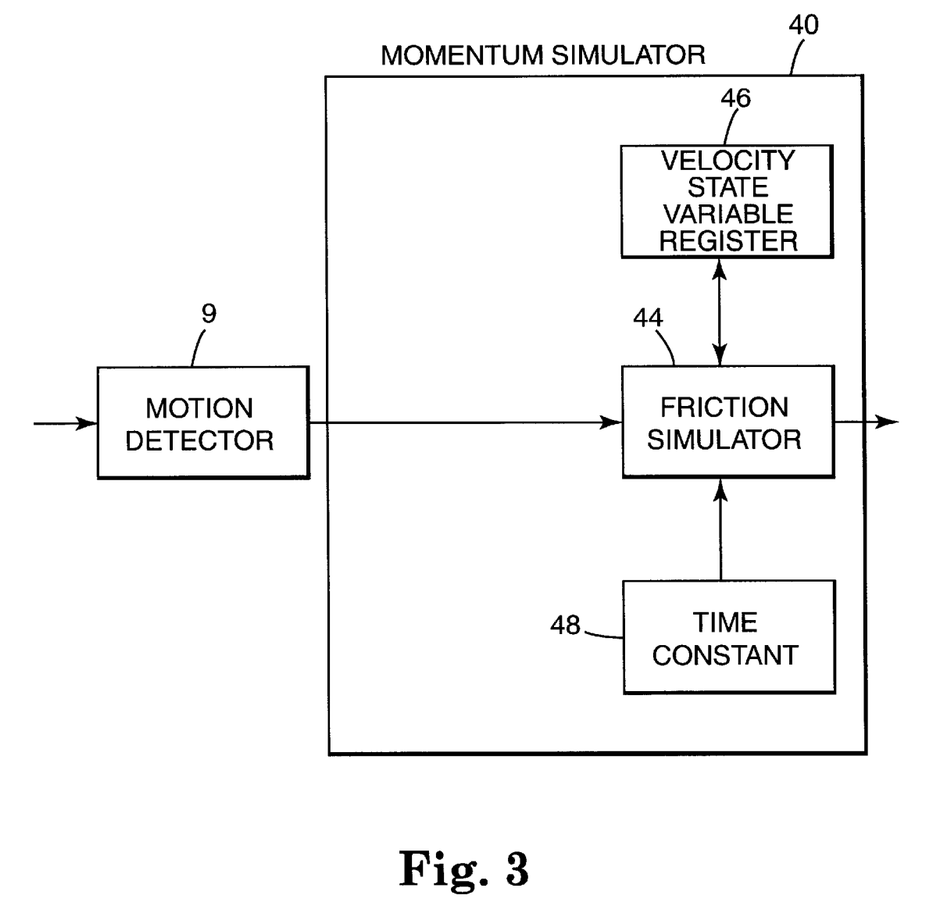
FIG. 3 is a block diagram illustrating one embodiment of a momentum simulator or emulator for an optical motion translation type screen pointer device that provides inertial effects.

FIG. 3 is a block diagram illustrating one embodiment of a momentum simulator or emulator for an optical motion translation type screen pointer device that provides inertial effects. Momentum simulator 40 includes friction simulator or controller 44, velocity state variable register 46, and time constant 48. In one embodiment, momentum simulator 40 and motion detector 9 are integrated into a single IC package. In an alternative embodiment, momentum simulator 40 and motion detector 9 are separate ICs. Motion detector 9 outputs velocity data for X and Y dimensions as discussed above with reference to FIG. 1. In one embodiment, motion detector 9 multiplies velocity data by a multiplication factor, thereby normalizing the velocity data. The normalized velocity data is output to friction simulator 44, which, in effect, adds friction to the velocity data, and outputs gradually reduced velocity data. The output of friction simulator 44 may be coupled to any device that utilizes a screen pointer or cursor, including computers, cell phones, personal digital assistants (PDAs), digital cameras, portable game devices, or any other device using a screen pointer.

In one embodiment, the rate at which the velocity data is reduced by friction simulator 44 is based on an exponential decay with a time constant specified by the value of time constant 48. In one form of the invention, the value of time constant 48 may be specified by a user. Friction simulator 44 stores velocity data in velocity state variable register 46. Momentum simulator 40 is described in further detail below with reference to FIG. 4.

Figure 4:
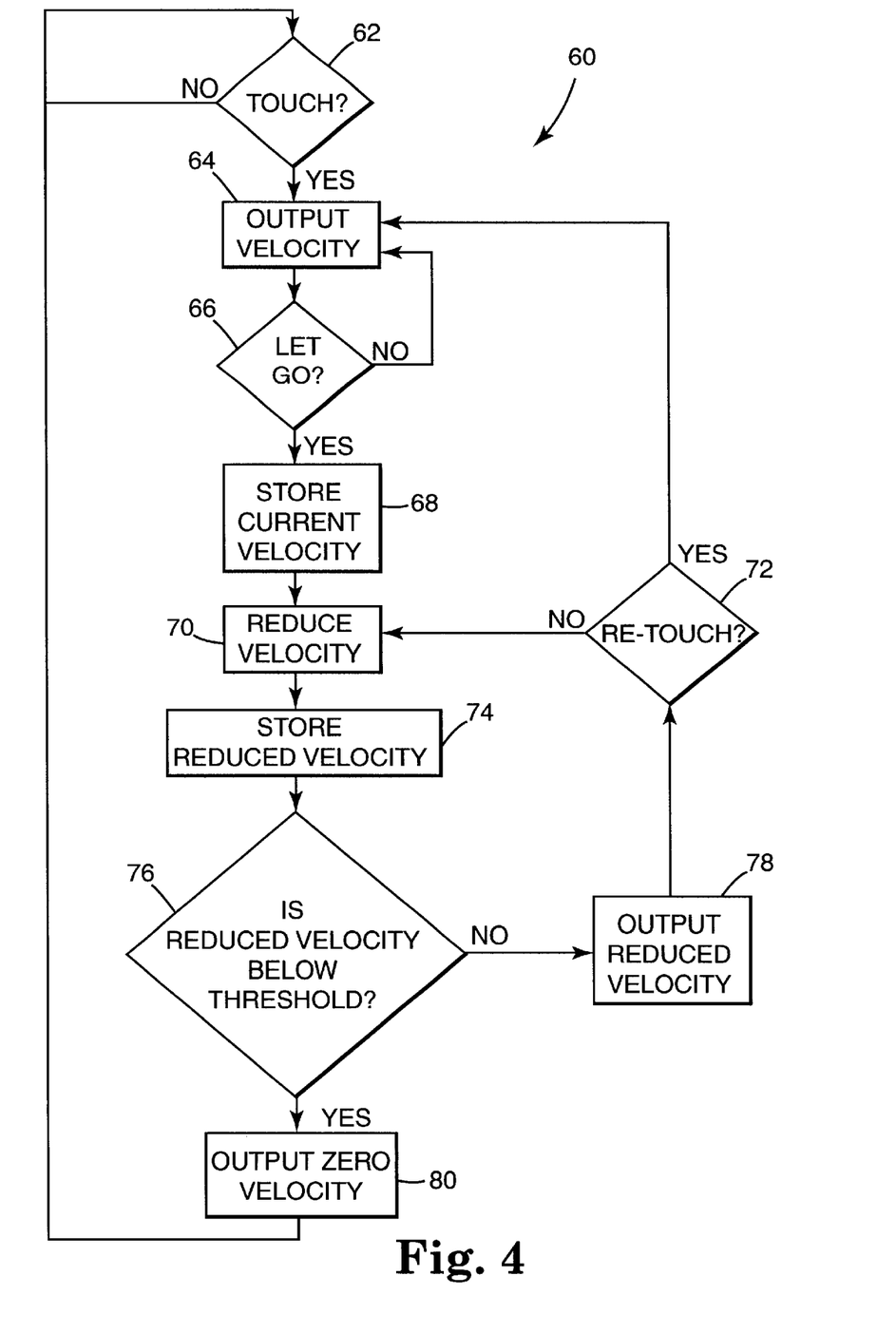
FIG. 4 is a flow diagram illustrating a process for providing inertial effects in an optical, motion translation type screen pointer device according to the present invention.

FIG. 4 is a flow diagram illustrating a process 60 for providing inertial effects in an optical, motion translation type screen pointer device according to the present invention. In step 62, motion detector 9 determines whether fingertip 6 is touching surface 5. If fingertip 6 is not touching surface 5, motion detector 9 outputs zero velocity, and continues to sense whether fingertip 6 touches surface 5. If fingertip 6 is touching surface 5, motion detector 9 calculates the X and Y components of the velocity of fingertip 6 as discussed above, and, in step 64, outputs the velocity data or movement data to friction simulator 44. In step 66, motion detector 9 senses whether fingertip 6 has been removed from surface 5. If fingertip 6 has not let go of surface 5, motion detector 9 continues to output velocity data as represented by step 64. Thus, as long as fingertip 6 continues to move across surface 5, motion detector 9 continues to output velocity data representative of the movement. The velocity data output by motion detector 9 is normalized. In one embodiment, motion detector 9 multiplies the velocity data by 100, and outputs the normalized velocity data to friction simulator 44. Friction simulator 44 outputs the normalized velocity data without adding friction, since fingertip 6 is still on surface 5.

In step 68, when fingertip 6 is removed from surface 5, the velocity at the time of removal, or the current velocity data, is stored in register 46. In step 70, friction simulator 44 decreases the velocity data in cycles by an amount determined by time constant 48. In step 74, friction simulator 44 stores the reduced velocity data for the current cycle in register 46. In step 76, friction simulator 44 determines whether the reduced velocity data stored in register 46 is below a specified threshold level. If the reduced velocity data is below the specified threshold level, friction simulator 44 outputs zero velocity in step 80, and motion detector 9 again waits for fingertip 6 to touch surface 5 as indicated by step 62. If the reduced velocity data stored in register 46 is not below the specified threshold level, in step 78, friction simulator 44 outputs the reduced velocity data. If fingertip 6 does not re-touch surface 5 (step 72), friction simulator 44 continues to gradually reduce the velocity data and output the reduced velocity data (steps 70, 74, 76, and 78) until the velocity data is below the specified threshold level. At step 72, if fingertip 6 re-touches surface 5, the process jumps to step 64, where motion detector 9 determines the current velocity of movement and outputs corresponding velocity data.

To further illustrate the process 60 according to one embodiment of the present invention, an example will be provided. Assume that the time constant 48 is one second, and that momentum simulator 40 outputs velocity data at 100 samples/second. These values are chosen to simplify the mathematics, and other values may be more appropriate for a commercial device. Assume further that fingertip 6 has just been removed from surface 5, and that the normalized velocity output by motion detector 9 at the time of removal is 1.0 inches/second. Friction simulator 44 stores the normalized velocity in register 46. During the first cycle period (i.e., the first millisecond), friction simulator 44 decreases the velocity stored in register 46 by 1 percent, stores the decreased velocity (i.e., 0.9900 inches/second) in register 46, and outputs the decreased velocity. During the second cycle period, friction simulator 44 again decreases the velocity stored in register 46 by 1 percent, stores the decreased velocity (i.e., 0.9801 inches/second) in register 46, and outputs the decreased velocity. Friction simulator 44 continues to decrease the velocity by 1 percent each millisecond until the velocity is below the specified threshold value, at which point friction simulator 44 outputs a value of zero velocity.

For a time constant 48 of 1 second, after the first second, friction simulator 44 drives the initial velocity of 1 inch/second to 0.37 inches/second. After two seconds, friction simulator 44 drives the velocity down to 0.14 inches/second. Assuming that the specified threshold value is 0.10 inches/second, friction simulator 44 drives the initial velocity down to zero just after 2 seconds. Other values for time constant 48 may be chosen to provide a desired level of friction. In addition, acceleration and deceleration characteristics may be explicitly defined by a user. In one embodiment, faster flicks will result in larger initial velocities and longer settling times, and slower flicks will result in smaller initial velocities and shorter settling times. In one embodiment, the inertial motion may be stopped at any time by re-touching surface 5. In one embodiment, the continued inertial movement of the present invention is provided only when a specified minimum acceleration has been provided by a user.

Rather than using a velocity profile based on exponential decay as discussed above, alternative techniques may be used. For example, in one embodiment, a user can graphically enter a sample velocity profile, and a mathematical representation of the entered profile is automatically generated. Friction simulator 44 then uses the mathematical representation to generate the desired velocity characteristics.

In another embodiment, a user can enter a "flick factor", which defines the screen pointer movement when the optical pointing device is flicked. For example, a 1 inch/second flick of the optical pointing device could cause the screen pointer to traverse the screen and slide to a stop.

Those of ordinary skill in the art will recognize that there are numerous ways for a user to enter data representing desired pointer movement characteristics. The entered data can then be used by friction simulator 44 to generate the desired response. For example, in one embodiment, a user may specify that the device is to have no friction, so that when the optical pointing device is flicked, the pointer will continue across the screen until it reaches a screen boundary, or until the user again contacts the pointing device. In another embodiment, a user may specify that the device is to provide further acceleration of the screen pointer after a user flicks the optical pointing device. Such further acceleration could not be provided with a simple mechanical track ball, due to the laws of physics. When a track ball has been released, it can not accelerate further unless pushed by a user. Any mathematical function or arbitrary curve may be entered by a user to specify the desired response of the optical pointing device, including functions or curves that eventually result in zero velocity, and functions and curves that result in continued velocity and/or acceleration after a user stops contacting the optical pointing device. The continued velocity and/or acceleration can be overridden by the user by contacting the optical pointing device. A user may exactly specify the desired characteristics of the optical pointing device for each particular application.

It will be understood by a person of ordinary skill in the art that functions performed by momentum simulator 40 may be implemented in hardware, software, firmware, or any combination thereof. The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

As one example, rather than implementing the inertial properties or other movement characteristics in a sensor or other chip (e.g., momentum simulator 40) within an optical pointing device, the desired movement characteristics may be implemented in a software driver of a host device (e.g., computer, PDA, digital camera, cell phone, portable game device, etc.) coupled to the optical pointing device.

Embodiments of the present invention provide numerous benefits, including the ability to increase the dynamic range of an optical pointing device, which is particularly useful for larger screens. Small hand movements can result in large screen pointer movements. Also, an optical pointing device like that shown in FIG. 1 can be made to feel and operate just like a mechanical track ball, which may be desirable to individuals who are familiar with operating such mechanical pointing devices.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An apparatus for controlling a position of a screen pointer for an electronic device having a display screen, the apparatus comprising:
    an imaging surface against which a portion of the tip of a human digit may be placed;
    a light source for illuminating that portion of the tip of the digit that is placed against the imaging surface, thereby generating reflected images;
    a motion transducer;
    a lens for receiving the reflected images and directing the reflected images onto the motion transducer, the motion transducer generating digital representations of the reflected images, the motion transducer generating a first set of movement data based on the digital representations of the reflected images, the first set of movement data indicative of motion of the tip of the digit across the imaging surface; and
    a controller configured to generate a second set of movement data when the tip of the human digit is removed from the imaging surface, thereby leaving the imaging surface free from human contact, the second set of movement data indicative of motion of the tip of the digit across the imaging surface prior to removal of the tip.

2. The apparatus of claim 1, wherein the second set of movement data is based on an exponential decay.

3. The apparatus of claim 2, wherein characteristics of the exponential decay are user specifiable.

4. The apparatus of claim 2, wherein characteristics of the exponential decay are based on a user specifiable time constant.

5. The apparatus of claim 1, wherein characteristics of the second set of movement data are user definable.

6. The apparatus of claim 5, wherein characteristics of the second set of movement data are defined by a graphical curve provided by a user.

7. The apparatus of claim 5, wherein characteristics of the second set of movement data are defined by a mathematical function provided by a user.

8. The apparatus of claim 1, wherein characteristics of the first set and second set of movement data are user definable.

9. The apparatus of claim 1, wherein the controller is configured to stop generating the second set of movement data when the tip of the human digit is replaced on the imaging surface.

10. The apparatus of claim 1, wherein the second set of movement data is based on inertial properties of a mechanical screen pointing device.

11. A method of controlling a position of a screen pointer for an electric device having a screen display, the method comprising:
   placing a portion of an appendage of the human hand against an imaging surface;
   directing light onto the imaging surface to illuminate that portion of the appendage that is against the imaging surface;
   focusing images reflected from the portion of the appendage onto an array of photo detectors;
   digitizing output values of the photo detectors, thereby generating digital representations of the reflected images;
   correlating at least one version of a first one of the digital representations with at least version of a second one of the digital representations to generate a first set of motion data indicative of motion in orthogonal axes across the imaging surface by the appendage;
   adjusting the position of the screen pointer in accordance with the first set of motion data;
   generating a second set of motion data based on at least a subset of the first set of motion data after the appendage is removed from the imaging surface leaving the imaging surface free from human contact; and
   adjusting the position of the screen pointer in accordance with the second set of motion data after the appendage is removed from the imaging surface.

12. The method of claim 11, wherein the second set of motion data is based on an exponential decay.

13. The method of claim 12, and further comprising:
   receiving motion definition data from a user specifying characteristics of the exponential decay.

14. The method of claim 12, and further comprising:
   receiving time constant data from a user, the time constant data defining characteristics of the exponential decay.

15. The method of claim 11, and further comprising:
   receiving motion definition data from a user specifying characteristics of the second set of motion data.

16. The method of claim 15, wherein the motion definition data is a graphical representation of desired characteristics of the second set of motion data.

17. The method of claim 15, wherein the motion definition data is a mathematical function.

18. The method of claim 11, and further comprising:
   receiving motion definition data from a user specifying characteristics of the first set and second set of motion data.

19. The method of claim 11, and further comprising:
   stopping motion of the screen pointer when the appendage is replaced on the imaging surface.

20. The method of claim 11, wherein the second set of motion data is based on inertial properties of a mechanical screen pointing device.

21. A method of controlling a position of a screen pointer for an electronic device having a screen display, the method comprising:
   directing light onto a work surface, thereby generating reflected images;
   focusing the reflected images onto an array of photo detectors;
   moving the array of photo detectors relative to the work surface, at a substantially constant distance from the work surface;
   generating digital representations of the reflected images based on outputs of the photo detectors;
   correlating at least one version of a first one of the digital representations with at least one version of a second one of the digital representations to generate a first set of motion data indicative of the motion of the array of photo detectors relative to the work surface;
   adjusting the position of the screen pointer in accordance with the first set of motion data;
   generating a second set of motion data based on at least a subset of the first set of motion data when the array of photo detectors is lifted from the work surface beyond the substantially constant distance; and
   adjusting the position of the screen pointer in accordance with the second set of motion data.

22. The method of claim 21, wherein the second set of motion data is based on an exponential decay.

23. The method of claim 22, and further comprising:
   receiving motion definition data from a user specifying characteristics of the exponential decay.

24. The method of claim 22, and further comprising:
   receiving time constant data from a user, the time constant data defining characteristics of the exponential decay.

25. The method of claim 21, and further comprising:
   receiving motion definition data from a user specifying characteristics of the second set of motion data.

26. The method of claim 25, wherein the motion definition data is a graphical representation of desired characteristics of the second set of motion data.

27. The method of claim 25, wherein the motion definition data is a mathematical function.

28. The method of claim 21, and further comprising:
   receiving motion definition data from a user specifying characteristics of the first set and second set of motion data.

29. The method of claim 21, wherein the second set of motion data is based on inertial properties of a mechanical screen pointing device.

30. An apparatus for controlling a position of a screen pointer for an electronic device having a display screen, the apparatus comprising:
   a light source for illuminating a work surface, thereby generating reflected images;
   a motion transducer movable relative to the work surface at a substantially constant distance from the work surface;
   a lens for receiving the reflected images and directing the reflected images onto the motion transducer, the motion transducer configured to generate digital representations of the reflected images, the motion transducer configured to generate a first set of movement data based on the digital representations of the reflected images, the first set of movement data indicative of motion of the motion transducer relative to the work surface; and
   a controller configured to generate a second set of movement data when the motion transducer is lifted past the substantially constant distance from the work surface, the second set of movement data indicative of motion of the motion transducer relative to the work surface prior to the motion transducer being lifted past the substantially constant distance.

31. The apparatus of claim 30, wherein the second set of movement data is based on an exponential decay.

32. The apparatus of claim 31, wherein characteristics of the exponential decay are user specifiable.

33. The apparatus of claim 31, wherein characteristics of the exponential decay are based on a user specifiable time constant.

34. The apparatus of claim 30, wherein characteristics of the second set of movement data are user definable.

35. The apparatus of claim 34, wherein characteristics of the second set of movement data are defined by a graphical curve provided by a user.

36. The apparatus of claim 34, wherein characteristics of the second set of movement data are defined by a mathematical function provided by a user.

37. The apparatus of claim 30, wherein characteristics of the first set and second set of movement data are user definable.

38. The apparatus of claim 30, wherein the second set of movement data is based on inertial properties of a mechanical screen pointing device.

39. A computer-readable medium having computer-executable instructions for performing a method of generating movement data for controlling a position of a screen pointer for an electronic device having a screen display and an optical pointing device, the optical pointing device generating movement data when in contact with an imaging surface, the movement data indicative of relative movement between the imaging surface and the optical pointing device, comprising:

identifying when a loss of contact occurs between the optical pointing device and the imaging surface;

identifying a first set of movement data, the first set of movement data indicative of the relative movement between the imaging surface and the optical pointing device prior to the loss of contact; and     generating a second set of movement data based on the first set of movement data when a loss of contact occurs between the optical pointing device and the imaging surface, the second set of movement data causing a gradual decrease in a velocity of the screen pointer.

\* \* \* \* \*